United States Patent
C

(10) Patent No.: US 11,183,975 B2
(45) Date of Patent: Nov. 23, 2021

(54) WINDOW BASED SUPPLY VOLTAGE CONDITIONING CIRCUIT FOR NOISE FILTERING

(71) Applicant: TEXAS INSTRUMENTS INCORPORATED, Dallas, TX (US)

(72) Inventor: Sahiti Priya C, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 141 days.

(21) Appl. No.: 16/504,385

(22) Filed: Jul. 8, 2019

(65) Prior Publication Data

US 2020/0336114 A1 Oct. 22, 2020

(30) Foreign Application Priority Data

Apr. 20, 2019 (IN) .............................. 201941015765

(51) Int. Cl.
| | |
|---|---|
| H03G 3/20 | (2006.01) |
| H03F 1/26 | (2006.01) |
| H03F 1/02 | (2006.01) |
| H03M 1/38 | (2006.01) |
| H03F 3/181 | (2006.01) |
| H03F 3/45 | (2006.01) |
| H03F 3/217 | (2006.01) |

(52) U.S. Cl.
CPC .............. *H03F 1/26* (2013.01); *H03F 1/025* (2013.01); *H03F 3/181* (2013.01); *H03F 3/2175* (2013.01); *H03F 3/45* (2013.01); *H03M 1/38* (2013.01)

(58) Field of Classification Search
CPC .... H03F 1/0211; H03F 1/0216; H03F 1/0227; H03F 1/0238; H03M 1/38
USPC .......................... 330/127, 136, 297; 341/156
See application file for complete search history.

(56) References Cited

U.S. PATENT DOCUMENTS

| | | | |
|---|---|---|---|
| 2009/0091382 A1* | 4/2009 | Determan | H03F 1/3264 330/10 |
| 2011/0080219 A1* | 4/2011 | Young, III | H03G 3/007 330/279 |
| 2020/0235712 A1* | 7/2020 | May | H03G 3/3005 |

* cited by examiner

*Primary Examiner* — Steven J Mottola
(74) *Attorney, Agent, or Firm* — John R. Pessetto; Charles A. Brill; Frank D. Cimino

(57) ABSTRACT

A supply voltage conditioning circuit comprises a differential amplifier, a comparator, a sample and hold (S/H) circuit, and a delay circuit. The differential amplifier receives an input supply voltage and a reference voltage, and outputs a difference signal. The comparator receives the difference signal and a value representative of a noise margin, and outputs a control signal indicative of whether the difference signal is greater than the value representative of the noise margin. The S/H circuit samples the input supply voltage in response to the control signal indicating the difference signal is greater than the noise margin, and outputs a substantially noise free supply voltage. This allows the output supply voltage to track underlying changes in the input supply voltage but filter out noise in the input supply voltage. The delay circuit receives and delays the output supply voltage to generate the reference voltage.

5 Claims, 6 Drawing Sheets

US 11,183,975 B2

WINDOW BASED SUPPLY VOLTAGE CONDITIONING CIRCUIT FOR NOISE FILTERING

CROSS-REFERENCE TO RELATED APPLICATIONS

This application claims priority to Indian Provisional Application No. 201941015765, filed Apr. 20, 2019, which is hereby incorporated by reference.

BACKGROUND

Class-H boosted amplifiers compare an audio input signal to a supply voltage and determine whether a boosted supply voltage is needed to provide the desired amplification for the audio input signal. Many Class-H boosted amplifiers implement hysteresis between boost on and boost off thresholds to prevent overly frequent boost switching near the threshold for boosted supply voltage. However, noise in the supply voltage can cause corresponding noise in the boost on and boost off thresholds, which in turn leads to random boost switching near the threshold for boosted supply voltage despite the hysteresis between the boost on and boost off thresholds.

Some audio limiters and compressors which limit the audio signals based on the supply voltage implement upper and lower limiter thresholds with hysteresis, similar to Class-H boosted amplifiers and the boost on and boost off thresholds. Noise in the supply voltage causes corresponding noise in the upper and lower limiter thresholds, which in turn causes variations in the limiter gain applied to an audio input signal. Random boost switching or variations in the limiter gain can cause spurious tones and audible artifacts in the resulting amplified audio signal and degrade the total harmonic distortion (THD) rating of the amplifier.

Some Class-H boosted amplifiers and audio limiters and compressors implement a low pass filter in an attempt to prevent random boost switching and variations in limiter gain due to noise in the supply voltage. Although a low pass filter reduces noise amplitude in the supply voltage, it does not remove it completely, and the reduced noise amplitude can still cause random boost switching and variation in limiter gain.

SUMMARY

An example supply voltage conditioning circuit comprises a differential amplifier, a comparator, a sample and hold (S/H) circuit, and a delay circuit. The differential amplifier has a first input coupled to an input voltage node and a second input for a second differential amplifier input. The comparator has a first input coupled to an output of the differential amplifier and a second input for a second comparator input. The S/H circuit has a first input coupled to an output of the comparator and a second S/H input coupled to the input voltage node. The delay circuit has an input coupled to an output of the S/H circuit and an output coupled to the second differential amplifier input.

The differential amplifier is configured to generate a difference signal representing a difference between an input voltage on the input voltage node and the second differential amplifier input. The second comparator input is configured to receive a value representative of a noise margin for the input voltage. In some examples, the value representative of the noise margin is based on characteristics of a voltage source configured to generate the input voltage on the input voltage node. In some examples, the value representative of the noise margin is based on characteristics of an analog to digital converter configured to convert an analog supply voltage into the input voltage on the input voltage node. The comparator is configured to generate a control signal indicative of whether the difference signal is greater than the value representative of the noise margin.

The S/H circuit is configured to sample an input voltage on the input voltage node based on the comparator output to obtain an output supply voltage. In some examples, the S/H circuit is configured to sample the input voltage in response to the control signal indicating the difference signal is greater than the value representative of the noise margin. The output supply voltage is substantially noise free and tracks underlying changes in the input voltage greater than the value representative of the noise margin. The delay circuit is configured to delay the output supply voltage to obtain the reference voltage.

In some examples, the supply voltage conditioning circuit is included in a boost control system, which further comprises a successive approximation (SAR) analog to digital converter (ADC) and a Class-H algorithm circuit. The SAR ADC is configured to receive an analog input voltage and output the input voltage on the input voltage node. The supply voltage conditioning circuit is configured to filter the input voltage and output the output supply voltage. The Class-H algorithm circuit is configured to receive the output supply voltage and an audio input signal, and output a boost control signal. In some examples, the boost control system is coupled to a boost converter, which is configured to output a boosted supply voltage based on the boost control signal.

In some examples, the Class-H algorithm circuit is further configured to compare the output supply voltage to the audio input signal, and base the boost control signal on the comparison. In some examples, the Class-H algorithm circuit is further configured to determine a boost on threshold and a boost off threshold based on the output supply voltage, and compare the output supply voltage and the audio input signal using the boost on threshold and boost off threshold.

BRIEF DESCRIPTION OF THE DRAWINGS

For a detailed description of various examples, reference will now be made to the accompanying drawings in which.

DETAILED DESCRIPTION

Noise in the supply voltages of Class-H boosted amplifiers and audio compressors and limiters can cause corresponding noise in the boost on and boost off thresholds, and upper and lower limiter thresholds. Noise in the boost on and boost off thresholds results in random boost switching near the threshold for boosted supply voltage despite hysteresis between the boost on and boost off thresholds. Noise in the upper and lower limiter thresholds results in variation in the limiter gain. The disclosed supply voltage conditioning circuits filter the supply voltages of Class-H boosted amplifiers and audio compressors and limiters, preventing random boost switching and variation in the limiter gain.

An example supply voltage conditioning circuit includes a differential amplifier, a comparator, a sample and hold sub-circuit, and a delay sub-circuit. The differential amplifier determines a difference between an input supply voltage and a reference voltage. The comparator determines whether the difference between the input supply voltage and the reference voltage is greater than a noise margin, which based on characteristics of components generating the input supply voltage. The sample and hold sub-circuit samples the input supply voltage and holds an output supply voltage at the sampled value until the comparator indicates the difference between the input supply voltage and the reference voltage is greater than the noise margin.

In response to the difference being greater than the noise margin, indicating an underlying change in the supply voltage rather than merely noise, the sample and hold sub-circuit resamples the input supply voltage and holds the output supply voltage the resampled value. The output supply voltage is provided to other components on the integrated circuit, and to the delay sub-circuit, which delays it to obtain the reference voltage. This allows the reference voltage to change with the input supply voltage and ensures that only noise in the supply voltage is rejected.

In some examples, the supply voltage conditioning circuit is included in a Class-H boosted amplifier further comprising a successive approximation (SAR) analog to digital converter (ADC), a Class-H algorithm circuit, and a boost converter. The supply voltage conditioning circuit receives the output of the SAR ADC and provides the output supply voltage to the Class-H algorithm circuit. The Class-H algorithm circuit compares the output supply voltage to an audio input signal, and generates a boost control signal for the boost converter based on the comparison. The boost converter generates a boosted supply voltage based on the boost control signal.

Figure 1:
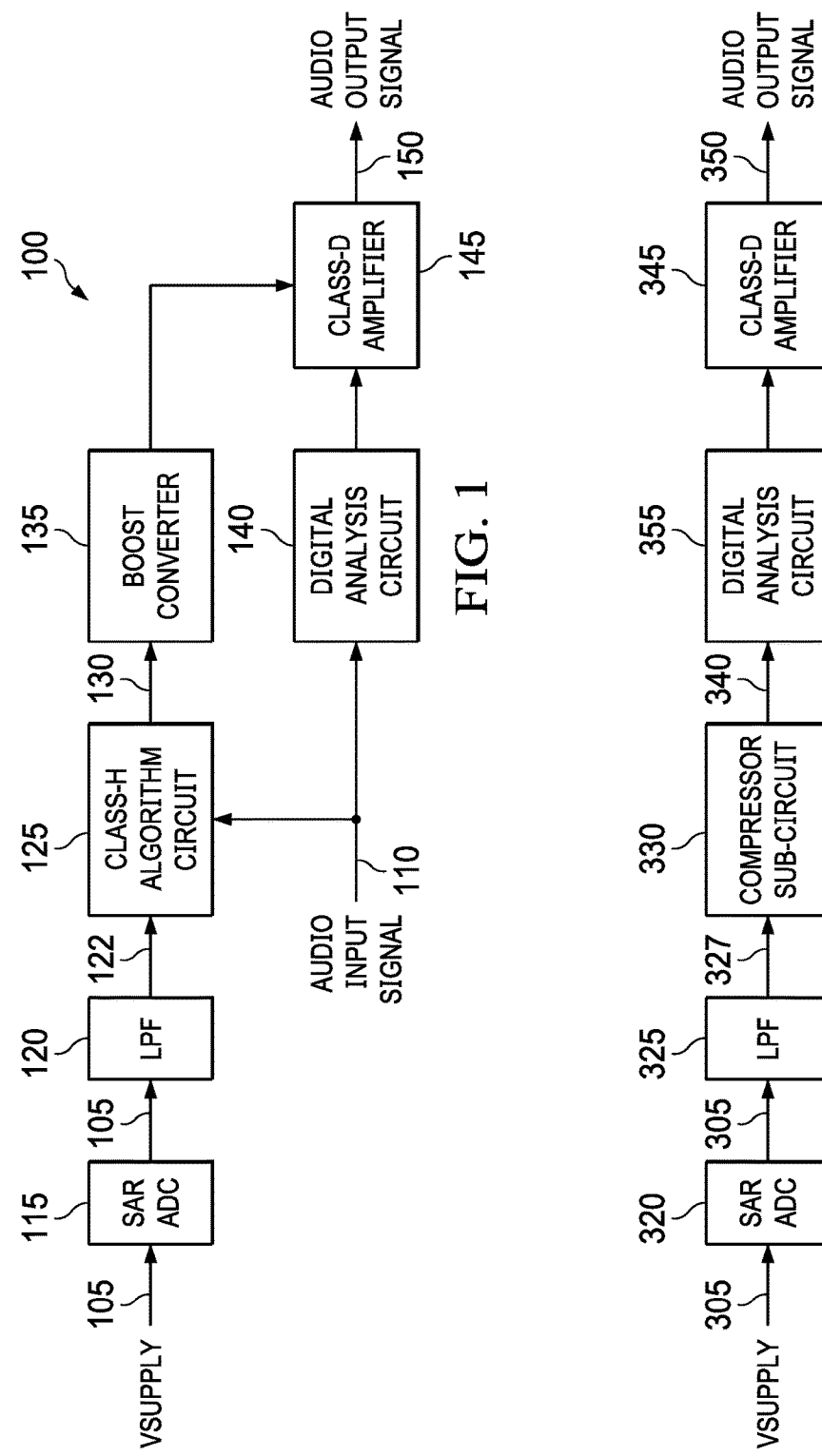
FIG. 1 illustrates a block diagram of an audio signal flow for an example Class-H boosted amplifier including a low pass filter.

FIG. 1 illustrates a block diagram of an audio signal flow for an example Class-H boosted amplifier 100 including a low pass filter 120. A supply voltage Vsupply 105 is input to a successive approximation (SAR) analog to digital converter (ADC) 115, which converts the analog supply voltage Vsupply 105 to a digital voltage signal. The output of SAR ADC 115 is provided to low pass filter (LPF) 120, which attempts to filter out noise in the Vsupply signal 105.

The filtered Vsupply signal 122 is input to a Class-H algorithm circuit 125, which also receives an audio input signal 110.

Class-H algorithm circuit 125 compares the filtered Vsupply signal 122 to the audio input signal 110 and determines whether or not to implement a boosted voltage. The resulting boost control signal 130 is provided to a boost converter 135, which provides a boosted voltage to Class-D amplifier 145 in response boost control signal 130 indicating voltage boost should be on. A digital analysis circuit 140 receives audio input signal 110 as well, and outputs a signal to Class-D amplifier 145. Class-D amplifier 145 amplifies the signal from digital analysis circuit 140 and outputs an audio output signal 150 to a speaker.

Noise in Vsupply signal 105 can cause Class-H algorithm circuit 125 to switch the boost on and off randomly near the threshold at which audio input 110 would prompt it to switch the boost on. The random boost switching leads to spurious tones and audible artifacts in audio output signal 150. LPF 120 reduces the noise amplitude in Vsupply signal 105, but does not remove it completely. Thus, even in Class-H boosted amplifiers implementing hysteresis between the boost on and boost off thresholds, the reduced noise amplitude can still cause random switching as shown in FIG. 2B.

Figure 2A:
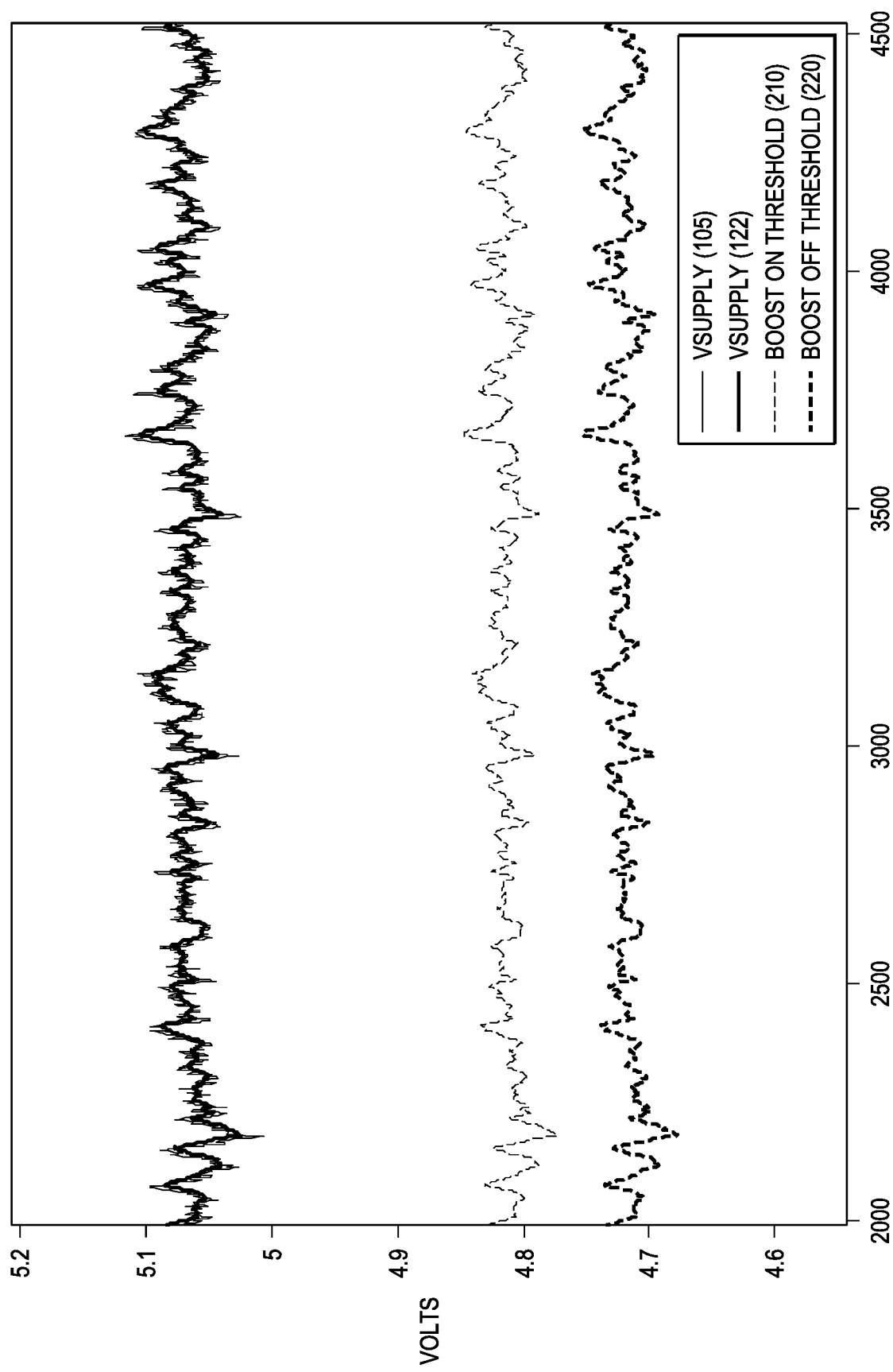
FIGS. 2A-2B show graphs of supply voltage, boost on and off thresholds, an output voltage, and a boost signal over time for the example Class-H boosted amplifier shown in FIG. 1.
Figure 2B:
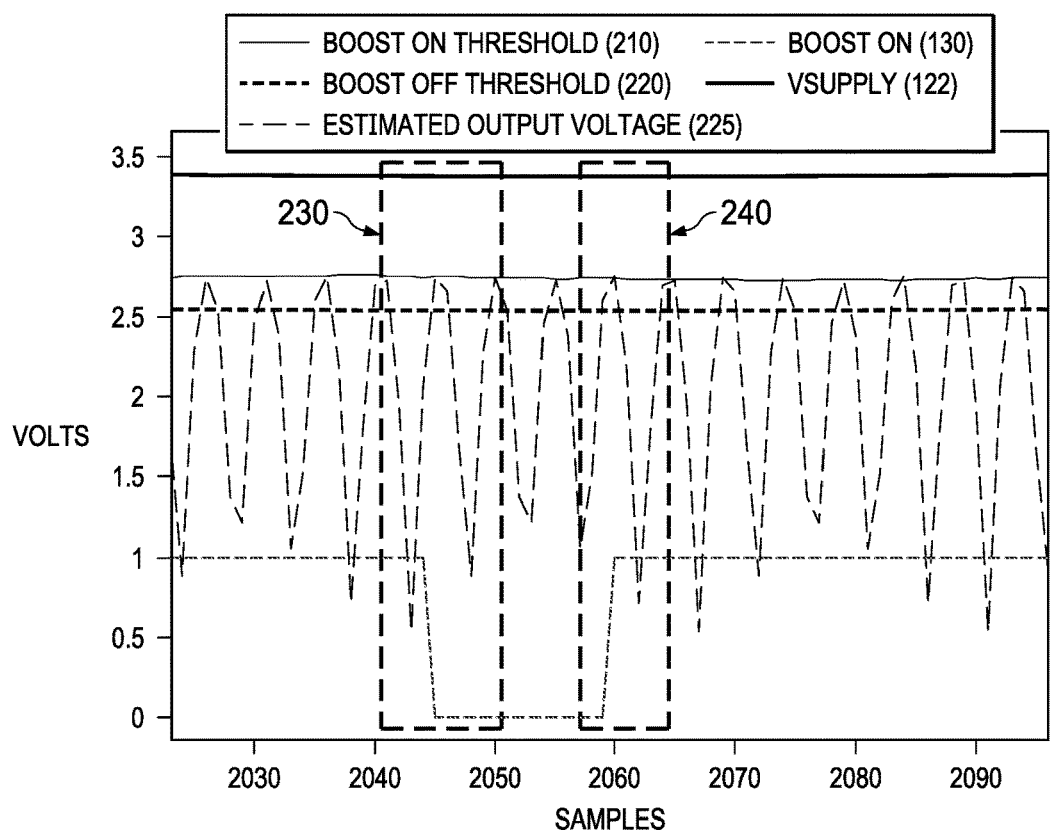

FIGS. 2A-2B show graphs of supply voltage, boost on and off thresholds, an output voltage, and a boost signal over time for example Class-H boosted amplifier 100 shown in FIG. 1. FIG. 2A shows a graph of Vsupply signal 105, filtered Vsupply signal 122, and boost thresholds for Class-H algorithm circuit 125, boost on threshold 210 and boost off threshold 220. Noise in Vsupply signal 105 is reduced but not eliminated from filtered Vsupply signal 122, and causes variations in boost thresholds 210 and 220. FIG. 2B shows a graph of boost thresholds 210 and 220, filtered Vsupply signal 122, an estimated output voltage 225, and boost control signal 130. Noise remaining in filtered Vsupply signal 122 cause the boost on and boost off thresholds 210 and 220 to vary such that the same output voltage 225 causes the boost control signal 230 to change to logic low at 230 and to logic high at 240.

Figure 3:
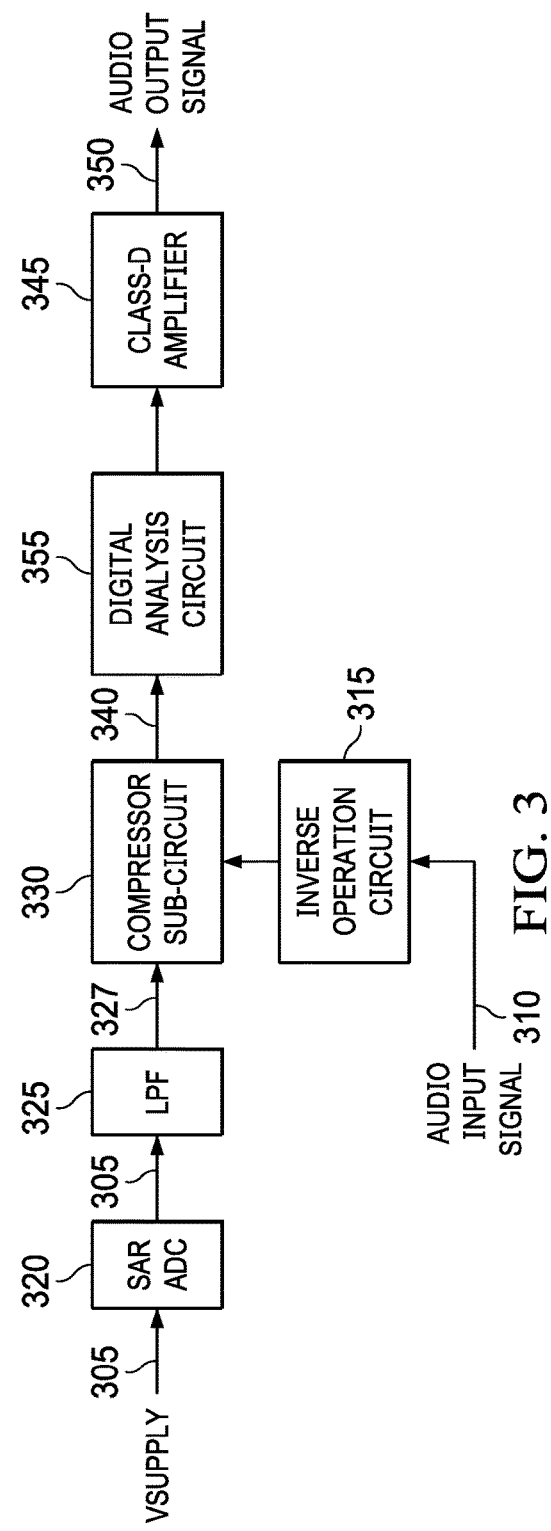
FIG. 3 illustrates a block diagram of an audio signal flow for an example compressor amplifier.

FIG. 3 illustrates a block diagram of an audio signal flow for an example compressor amplifier 300. Similar to example Class-H boosted amplifier 100 shown in FIG. 1, a supply voltage Vsupply 305 is input to an SAR ADC 320, the output of which is input to an LPF 325. LPF 325 attempts to filter out noise in Vsupply signal 305. An audio input signal 310 is input to an inverse operation circuit 315. A compressor sub-circuit 330 multiplies filtered Vsupply signal 327 by the output of the inverse operation circuit 315 to determine the exact gain factor 340, and applies it to audio input signal 310. A digital analysis circuit 355 receives the compressed audio signal from compressor sub-circuit 330, and outputs it to Class-D amplifier 345. Class-D amplifier 345 outputs an audio output signal 350 to a speaker.

Figure 4:
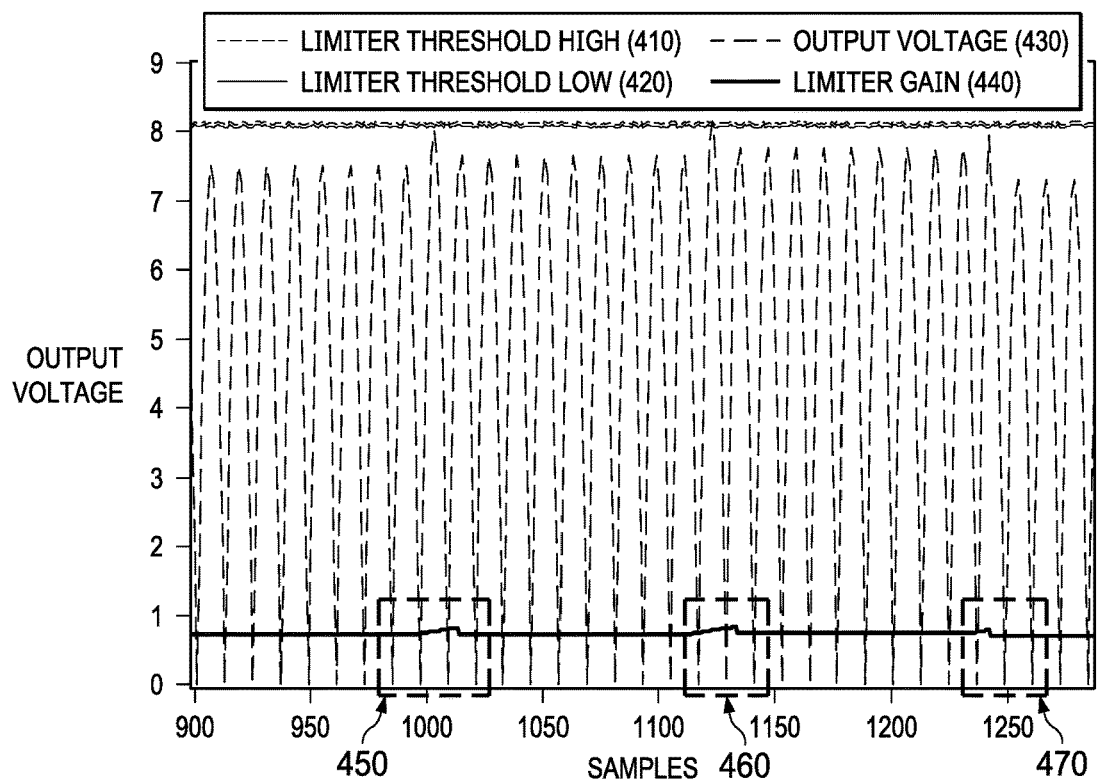
FIG. 4 illustrates a graph of limiter high and low thresholds, an output voltage, and a limiter gain over time for the example compressor amplifier shown in FIG. 3.

Any noise remaining in filtered Vsupply signal 327 causes variation in limiter thresholds of compressor amplifier 300, and by extension in gain factor 340, as shown in FIG. 4. FIG. 4 illustrates a graph of limiter high and low thresholds, an output voltage, and a limiter gain over time for example compressor amplifier 300 shown in FIG. 3. Limiter threshold high 410 and limiter threshold low 420 vary due to noise in filtered Vsupply signal 327. As shown at 450, 460, and 470, variations in the limiter thresholds 410 and 420 result in variations in limiter gain 440, despite the constant amplitude of output voltage 430.

Figure 5:
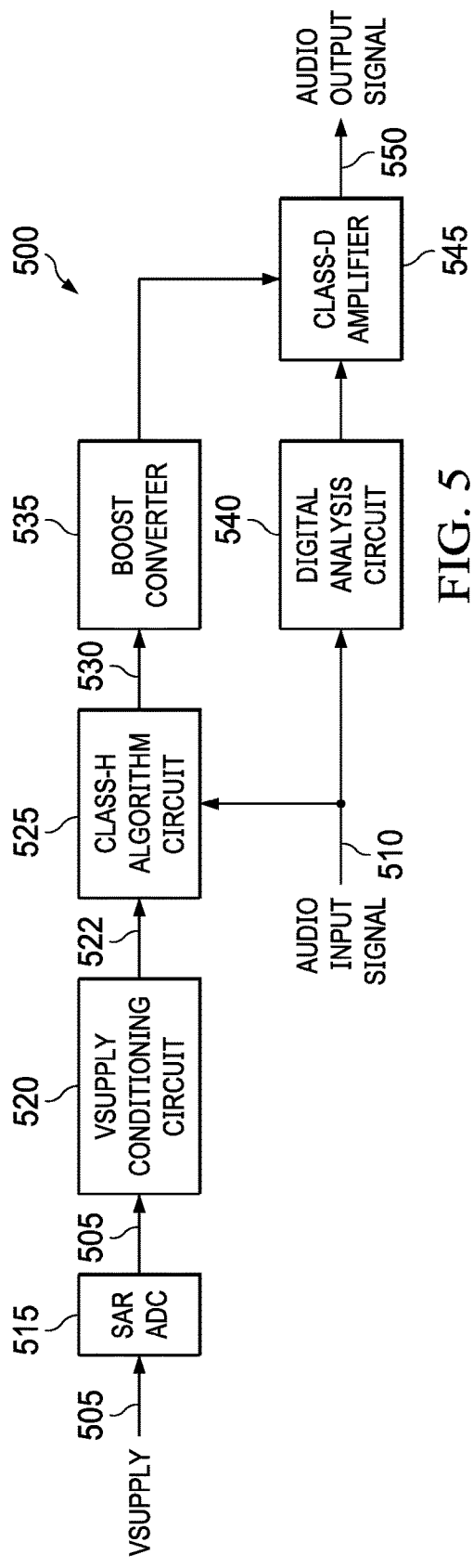
FIG. 5 illustrates a block diagram of an audio signal flow for an example Class-H boosted amplifier including a supply voltage conditioning circuit.

FIG. 5 illustrates a block diagram of an audio signal flow for an example Class-H boosted amplifier 500 including a supply voltage conditioning circuit 520. Example Class-H boosted amplifier 500 is similar to example Class-H boosted amplifier 100 shown in FIG. 1, except for the substitution of supply voltage conditioning circuit 520 in place of LPF 120. Supply voltage conditioning circuit 520 rejects noise in Vsupply signal 505, avoiding random switching of the boost and the resulting spurious tones and audible artifacts in the audio output signal 550.

Figure 6:
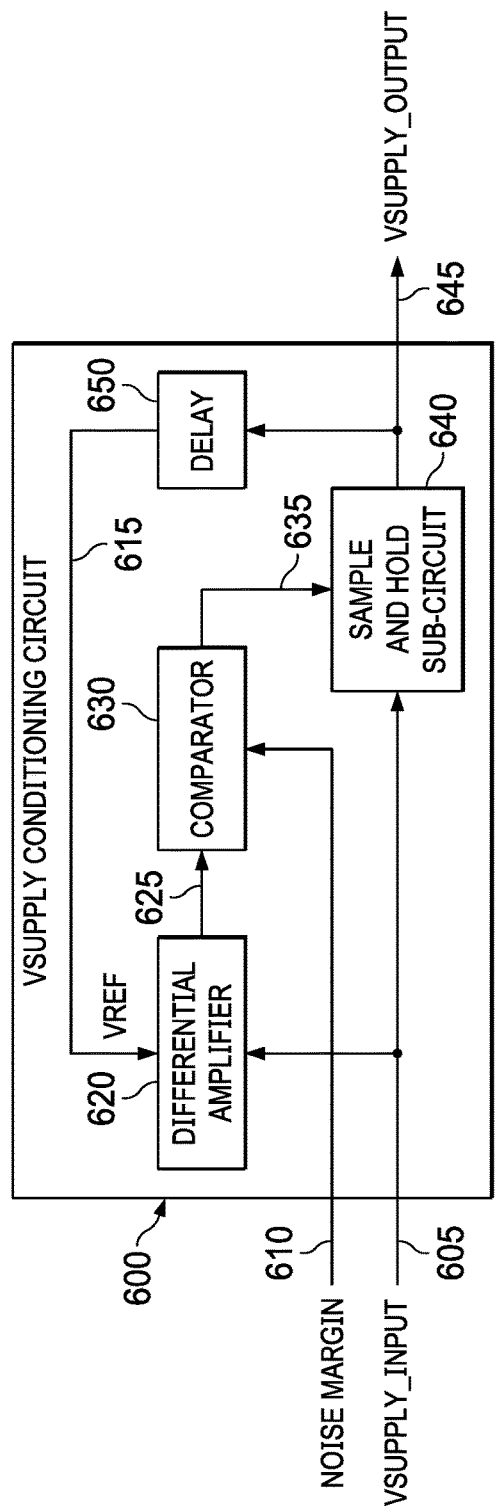
FIG. 6 illustrates an example supply voltage conditioning circuit.

FIG. 6 illustrates an example supply voltage conditioning circuit 600, which includes a differential amplifier 620, a comparator 630, a sample and hold sub-circuit 640, and a delay 650. Supply voltage conditioning circuit 600 receives a supply voltage Vsupply_input signal 605 and an anticipated noise margin 610, which is based on the expected noise in the Vsupply_input signal 605 due characteristics of a supply voltage source providing an analog supply voltage and an SAR ADC converting the analog supply voltage to digital Vsupply_input signal 605. Sample and hold sub-circuit 640 and differential amplifier 620 receive Vsupply_input signal 605. Differential amplifier 620 also receives a reference voltage Vref 615, and outputs a difference 625 between Vsupply_input signal 605 and Vref 615. Comparator 630 receives difference 625 from differential amplifier 620 and noise margin 610, and outputs a signal 635 indicative of whether difference 625 is greater than noise margin 610.

Sample and hold sub-circuit 640 receives signal 635 and Vsupply_input signal 605, and outputs a substantially noise free Vsupply_output signal 645. Sample and hold circuit 640 samples the voltage of Vsupply_input signal 605 and holds its value at a constant level in Vsupply_output signal 645. In response to signal 635 indicating difference 625 is greater than noise margin 610, sample and hold circuit 640 resamples the voltage of Vsupply_input signal 605 and updates the value of Vsupply_output signal 645 based on the newly sampled voltage of Vsupply_input signal 605. Vsupply_output signal 645 is provided to other components in the circuit, such as a Class-H algorithm circuit for a Class-H boosted amplifier. Delay 650 also receives Vsupply_output signal 645, and delays it to generate Vref 615. This allows the noise window to shift and track slow changes in Vsupply_input signal 605 while continuing to reject noise.

Figure 7A:
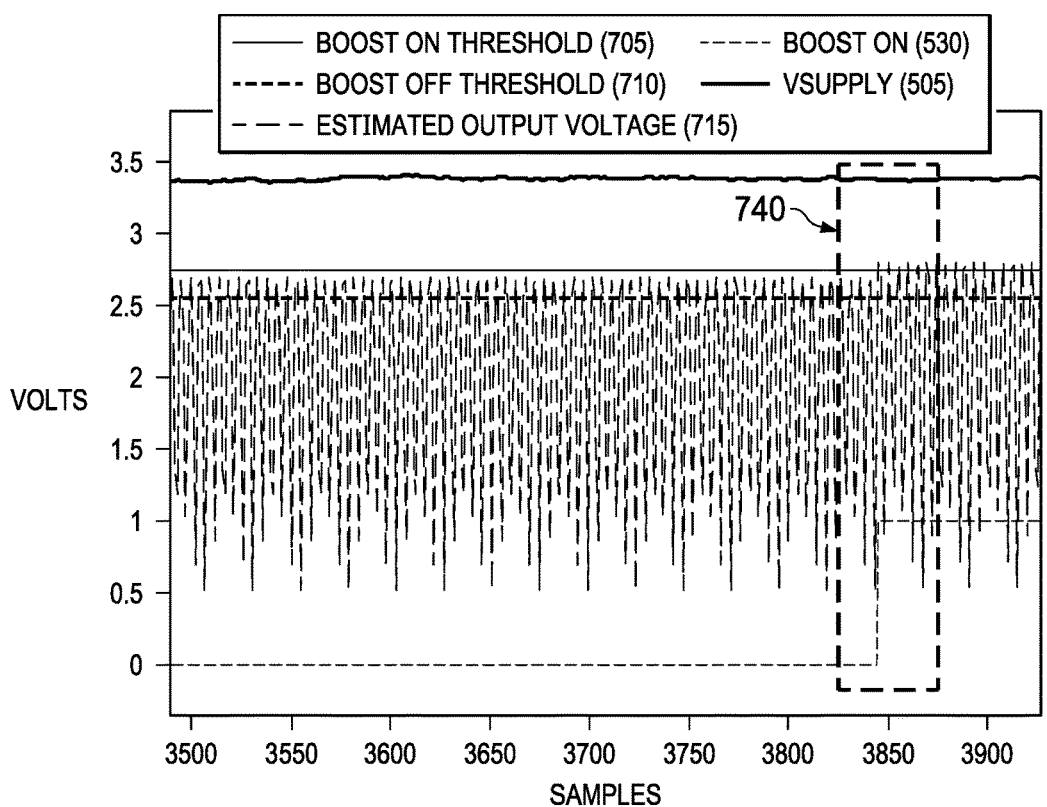
FIGS. 7A-7B show graphs of a supply voltage, boost on and off thresholds, an output voltage, and a boost signal over time for an example Class-H boosted amplifier including a supply voltage conditioning circuit.
Figure 7B:
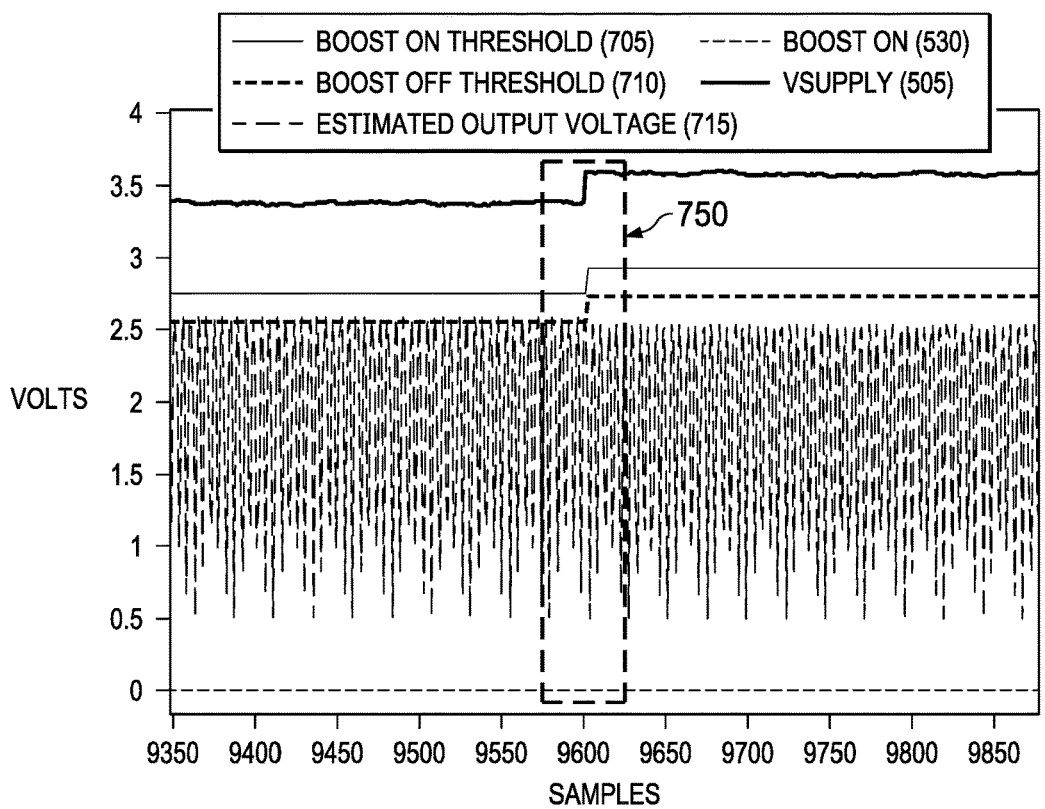

FIGS. 7A-7B show graphs of a supply voltage, boost on and off thresholds, an output voltage, and a boost control signal over time for the example Class-H boosted amplifier shown in FIG. 5 including the Vsupply conditioning circuit 600 shown in FIG. 6 in place of Vsupply conditioning circuit 520. FIG. 7A shows a graph of boost on and off thresholds 705 and 710, unfiltered Vsupply signal 505, an estimated output voltage 715, and boost control signal 530. Despite noise present in unfiltered Vsupply signal 505, Vsupply conditioning circuit 600 maintains a steady supply voltage to Class-H algorithm circuit 525, allowing boost on threshold 705 and boost off threshold 710 to remain constant. At 740, output voltage 715 increases above boost on threshold 705 and boost control signal 530 changes to logic high. FIG. 7B shows a graph of boost on and off thresholds 705 and 710, unfiltered Vsupply signal 505, an estimated output voltage 715, and boost control signal 530. At 750, unfiltered Vsupply signal 505 increases, illustrating an underlying change to the value of Vsupply signal 505 rather than noise. Boost on and off thresholds 705 and 710 increase by a corresponding amount but remain stable, illustrating how Vsupply conditioning circuit 600 tracks underlying changes in Vsupply signal 505 while continuing to reject noise.

Figure 8:
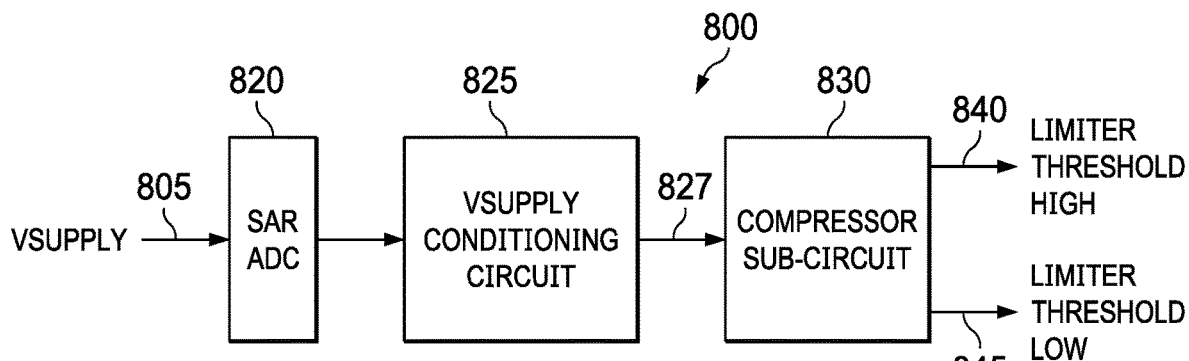
FIG. 8 illustrates a block diagram of an example power supply circuit for a compressor amplifier, including a supply voltage conditioning circuit.
Figure 9:
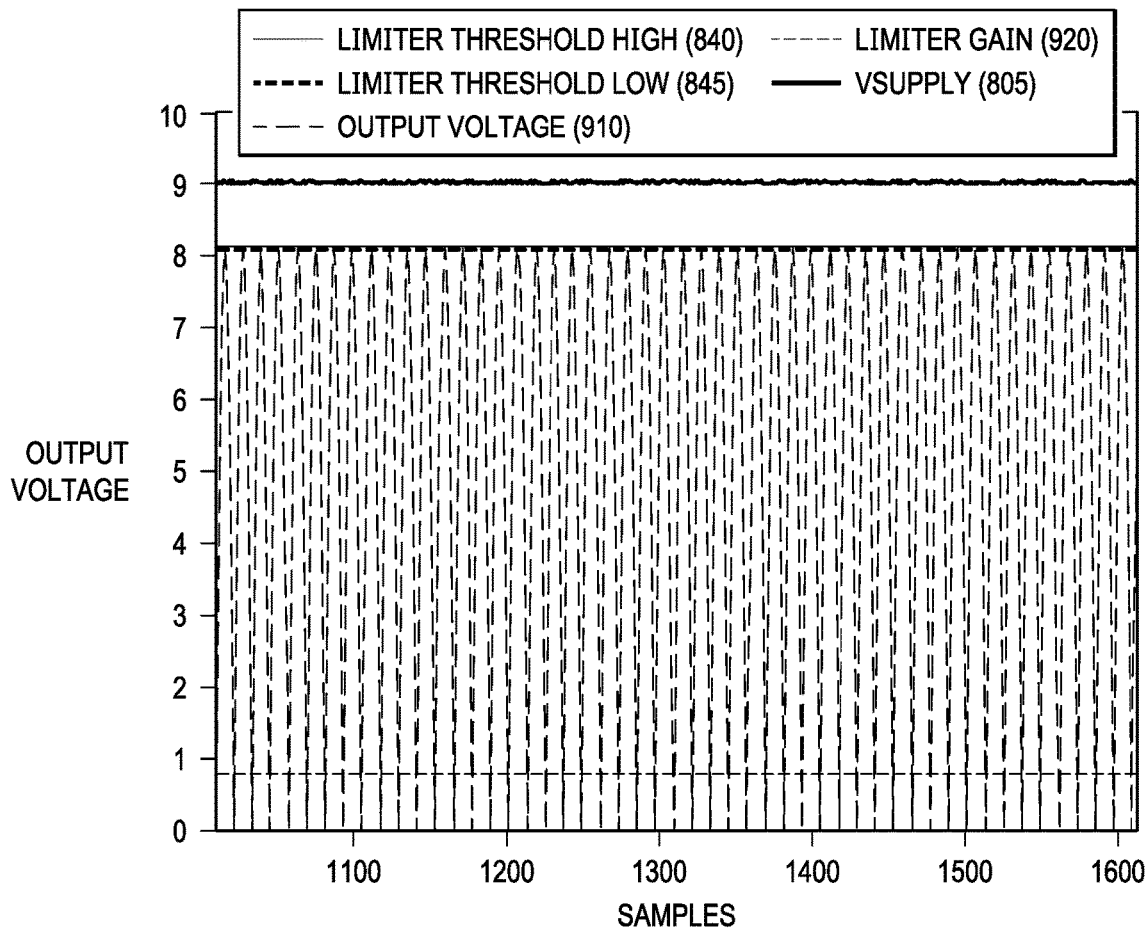
FIG. 9 shows a graph of limiter high and low thresholds, an unfiltered supply voltage signal, an output voltage, and a limiter gain over time for a compressor amplifier including the example power supply circuit shown in FIG. 8.

FIG. 8 illustrates a block diagram of an example power supply circuit 800 for a compressor amplifier, including Vsupply conditioning circuit 600. Example power supply circuit 800 includes an SAR ADC 820 and a compressor sub-circuit 830, similar to SAR ADC 320 and compressor sub-circuit 330 shown in FIG. 3. However, instead of LPF 325, power supply circuit 800 includes Vsupply conditioning circuit 600, which rejects noise in Vsupply signal 805 and stabilizes limiter threshold high 840 and limiter threshold low 845. FIG. 9 shows a graph of limiter high and low thresholds 840 and 845, unfiltered Vsupply signal 805, an output voltage 910, and a limiter gain 920 over time. Despite noise present in unfiltered Vsupply signal 805, Vsupply conditioning circuit 600 maintains a steady supply voltage to compressor sub-circuit 930, allowing limiter threshold high 840 and limiter threshold low 845 to remain constant. This in turn allows limiter gain 920 to remain constant, without the introduction of variations as shown at 450, 460, and 470 in FIG. 4.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Unless otherwise stated, in this description, the term "substantially" noise free means less than ten percent noise.

Modifications are possible in the described embodiments, and other embodiments are possible, within the scope of the claims.

What is claimed is:

1. A boost control system, comprising:
a successive approximation (SAR) analog to digital converter (ADC) configured to receive an analog input voltage and output a digital input voltage signal;
a voltage conditioning circuit configured to receive the digital input voltage signal and output a filtered voltage signal; and
a Class-H algorithm circuit configured to receive the filtered voltage signal and an input signal, and to output a boost control signal;
wherein the voltage conditioning circuit comprises:
a differential amplifier coupled to the SAR ADC, the differential amplifier configured to:
receive the digital input voltage signal and a reference voltage, and
generate a difference signal representing a difference between the digital input voltage signal and the reference voltage;
a comparator coupled to the differential amplifier, the comparator configured to:
receive the difference signal and a value representative of a noise margin, and
generate a control signal indicative of whether a value of the difference signal is greater than the noise margin;
a sample and hold (S/H) circuit coupled to the comparator, the S/H circuit configured to:
receive the digital input voltage signal and the control signal,
sample the digital input voltage signal based on the control signal, and
output the filtered voltage signal; and
a delay circuit coupled to the S/H circuit and the differential amplifier, the delay circuit configured to:
receive the filtered voltage signal, and
delay the filtered voltage signal in order to generate the reference voltage.

2. The boost control system of claim 1, wherein the value representative of the noise margin is based on characteristics of a voltage source configured to generate the analog input voltage.

3. The boost control system of claim 1, wherein the value representative of the noise margin is based on characteristics of the SAR ADC.

4. The boost control system of claim 1, wherein the S/H circuit is configured to sample the digital input voltage signal in response to the control signal indicating the value of the difference signal is greater than the value representative of the noise margin.

5. A boost control system, comprising:
   a successive approximation (SAR) analog to digital converter (ADC) configured to receive an analog input voltage and output a digital input voltage signal;
   a voltage conditioning circuit configured to receive the digital input voltage signal and output a filtered voltage signal; and
   a Class-H algorithm circuit configured to receive the filtered voltage signal and an input signal, and to output a boost control signal;
      wherein the Class-H algorithm circuit is further configured to compare the filtered voltage signal and the input signal, and wherein the boost control signal is based on the comparison;
      wherein the Class-H algorithm circuit is further configured to determine a boost on threshold and a boost off threshold based on the filtered voltage signal, and wherein the Class-H algorithm circuit is configured to compare the filtered voltage signal and the input signal using the boost on threshold and the boost off threshold.

* * * * *